US 8,348,583 B2

(12) United States Patent
Fujii et al.

(10) Patent No.: US 8,348,583 B2
(45) Date of Patent: Jan. 8, 2013

(54) CONTAINER AND LOADER FOR SUBSTRATE

(75) Inventors: Toshiaki Fujii, Fujisawa (JP); Osamu Horita, Fujisawa (JP); Koji Ohyama, Tokyo (JP); Toshiya Nakayama, Tokyo (JP); Fumio Sakiya, Hiroshima-ken (JP); Mineo Kinpara, Hiroshima-ken (JP)

(73) Assignee: Rorze Corporation, Fukuyama-shi (JP)

( * ) Notice: Subject to any disclaimer, the term of this patent is extended or adjusted under 35 U.S.C. 154(b) by 0 days.

(21) Appl. No.: 10/036,802

(22) Filed: Dec. 21, 2001

(65) Prior Publication Data

US 2002/0106267 A1     Aug. 8, 2002

Related U.S. Application Data

(63) Continuation-in-part of application No. 09/180,848, filed on Oct. 19, 1999, now abandoned.

(51) Int. Cl.
*B65G 49/07* (2006.01)
(52) U.S. Cl. ............... 414/217; 414/217.1; 414/411; 414/805; 414/939; 414/940
(58) Field of Classification Search ............ 414/217, 414/217.1, 292, 411, 416.03, 416.08, 937, 414/939, 940, 805, 810; 206/711
See application file for complete search history.

(56) References Cited

U.S. PATENT DOCUMENTS

| | | | |
|---|---|---|---|
| 4,619,572 A | 10/1986 | Lorenzelli et al. | |
| 5,169,272 A * | 12/1992 | Bonora et al. | 414/217.1 |
| 5,186,594 A * | 2/1993 | Toshima et al. | 414/217 |
| 5,246,218 A | 9/1993 | Yap et al. | |
| 5,364,219 A | 11/1994 | Takahashi et al. | |
| 5,586,585 A | 12/1996 | Bonora et al. | |
| 5,613,821 A | 3/1997 | Muka et al. | |
| 5,664,925 A | 9/1997 | Muka et al. | |
| 5,752,796 A | 5/1998 | Muka | |
| 5,772,386 A | 6/1998 | Mages et al. | |
| 5,810,537 A * | 9/1998 | Briner et al. | 414/217.1 |
| 5,829,939 A | 11/1998 | Iwai et al. | |

(Continued)

FOREIGN PATENT DOCUMENTS

EP     0827185     3/1998
JP     08-279546   10/1996

OTHER PUBLICATIONS

European Search Report for European Application No. 97946808.9-1226/0959495 issued Aug. 11, 2008.

*Primary Examiner* — James Keenan
(74) *Attorney, Agent, or Firm* — Oblon, Spivak, McClelland, Maier & Neustadt, L.L.P.

(57) ABSTRACT

A loader is provided, which is disposed in a low cleanliness room along a border between the low cleanliness room and a high cleanliness room, for transporting a dust free article between an inside of a container receiving the dust free article and the high cleanliness room, comprising a movable stage for mounting the container; an opening portion through which the dust free article is transported between the container and the high cleanliness room; a door for opening and closing the opening portion; a unifying means for unifying a cover of the container and the door when the container approaches the door; and a driving apparatus for moving the cover and the door unified within the loader to open and close the opening portion and the container.

18 Claims, 9 Drawing Sheets

U.S. PATENT DOCUMENTS

| | | | |
|---|---|---|---|
| 5,895,191 A | 4/1999 | Bonora et al. | |
| 6,013,920 A * | 1/2000 | Gordon et al. | 250/559.36 |
| 6,053,688 A | 4/2000 | Cheng | |
| 6,068,668 A | 5/2000 | Mastroianni | |
| 6,074,154 A * | 6/2000 | Ueda et al. | 414/217 |
| 6,082,951 A * | 7/2000 | Nering et al. | 414/217.1 |
| 6,158,946 A * | 12/2000 | Miyashita | 414/411 |
| 6,186,331 B1 * | 2/2001 | Kinpara et al. | 206/711 |
| 6,281,516 B1 * | 8/2001 | Bacchi et al. | 250/559.29 |
| 6,364,595 B1 * | 4/2002 | Bonora et al. | 414/416.1 |
| 6,406,245 B2 * | 6/2002 | Hasegawa et al. | 414/217 |
| 6,430,802 B1 * | 8/2002 | Miyajima | 29/464 |
| 6,736,582 B1 * | 5/2004 | Mages et al. | 414/217 |
| 6,824,344 B2 * | 11/2004 | Otaguro | 414/217.1 |
| 6,869,263 B2 * | 3/2005 | Gilchrist | 414/217 |
| 6,896,470 B1 * | 5/2005 | Chen et al. | 414/411 |
| 2004/0211701 A1 * | 10/2004 | Weaver | 206/710 |

* cited by examiner

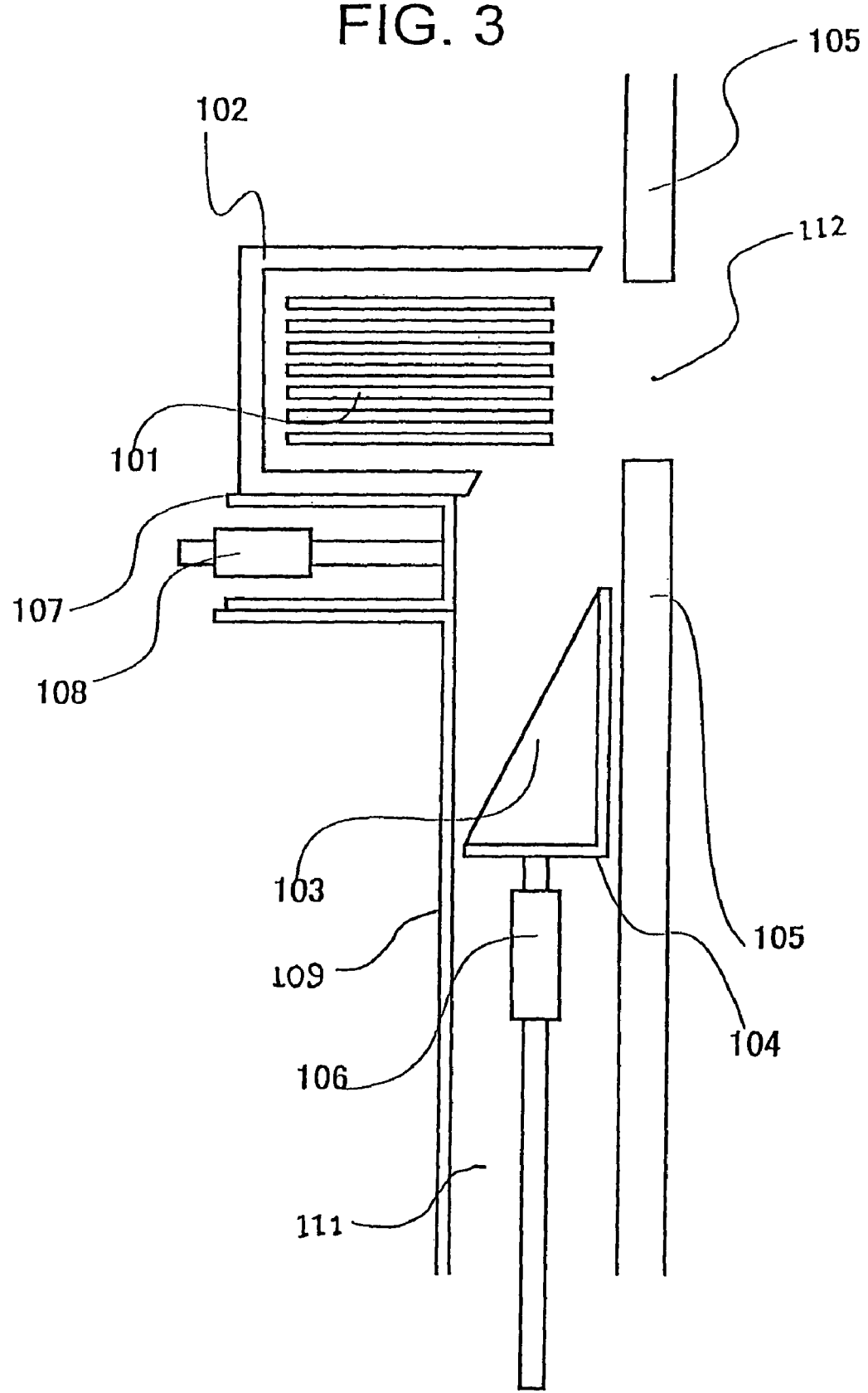

FIG. 6A
FIG. 6B
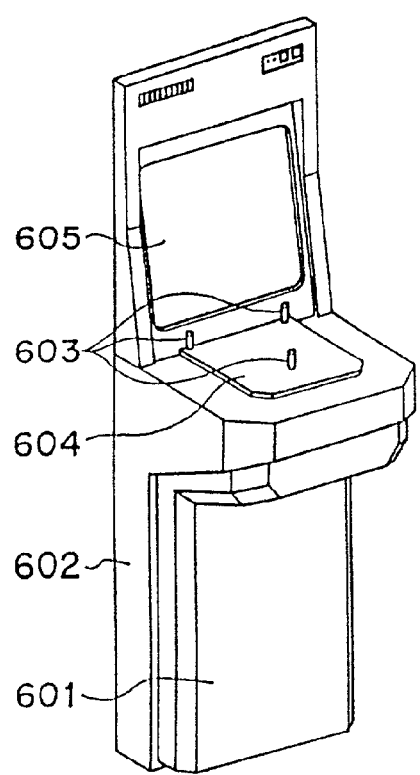
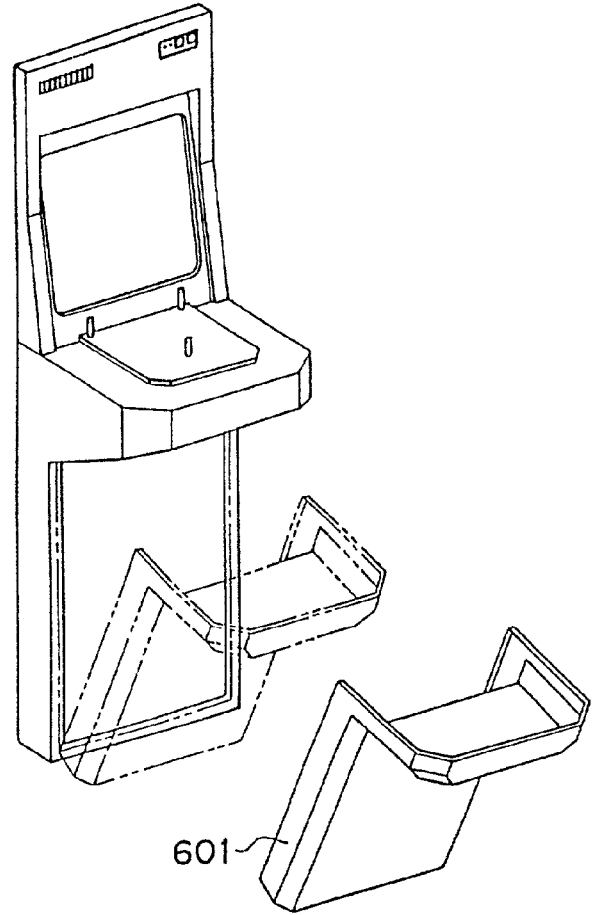

CONTAINER AND LOADER FOR SUBSTRATE

CROSS REFERENCE TO RELATED APPLICATION

This application is a continuation in part application of U.S. patent application Ser. No. 09/180,848, filed on Oct. 19, 1999, now abandoned which is incorporated herein in its entirety, which was a national stage application of PCT application PCT/JP97/04372, filed on Dec. 1, 1997.

BACKGROUND OF THE INVENTION

The present invention relates to a container and a loader for an article such as a substrate necessary to be kept under the condition of high cleanliness during transportation and working, in particular the present invention relates to transporting means (hereinafter referred to as "loader") to transport the substrate or the like between the container used for transporting the substrate or the like between a low cleanliness room and a high cleanliness room for working the substrate or the like.

The present invention is applicable to any article necessary to be kept under the condition of high cleanliness during transportation and working. It is described hereunder in relation to a semiconductor substrate such as a silicon wafer or a liquid crystal substrate, in particular a semiconductor wafer as an example, however, the present invention is not limited to the above.

The semiconductor substrate, in particular semiconductor wafer is contaminated when dust or vaporized organic compounds (hereinafter referred to as "dust") are attached thereto, thus leading to a lower productivity, i.e., the rate of producing a high-quality of product is low. It is therefore necessary to maintain high cleanliness in the surroundings of the substrate or the like when the semiconductor wafer is transported or worked. More specifically, the semiconductor wafer is one of the articles necessary to be kept under the condition of high cleanliness during transportation and working (hereinafter referred to as "dust free article").

In general, the semiconductor wafer is worked in a room where cleanliness is high (hereinafter referred to as a "high cleanliness room"), i.e., so called a clean room. On the other hand, when the semiconductor wafer is transported, the semiconductor wafer is received in an air-tight sealed container (hereinafter referred to as a "container"), the inside of which is kept under the condition of high cleanliness, and then, the container with the semiconductor wafer received therein is transported. Thus, the semiconductor wafer can be transported through a room in which the degree of cleanliness is low or outdoor (hereinafter referred to as "low cleanliness room"), avoiding the semiconductor wafer from being contaminated during transportation.

There is disposed a loader with an opening portion, which can be closed, in the border portion between the high cleanliness room and the low cleanliness room. The semiconductor wafer is transported by the above loader from the inner space of the container with high cleanliness for working the semiconductor wafer to the high cleanliness room (hereinafter referred to as "loading"), in addition, from the high cleanliness room to the inner space of the container with high cleanliness for transferring to another treatment step (hereinafter referred to as "unloading"). More specifically, the semiconductor wafer is moved through the above opening portion. The container has a cover (i.e., lid) in a direction to the opening portion of the loader, which cover is opened when the semiconductor wafer is transferred.

When the semiconductor wafer is not transported, the opening portion of the loader is kept closed so as to prevent dust from floating into the high cleanliness room from the low cleanliness room. A door may be disposed in the opening portion so that the opening portion can be opened or closed by the door.

In this case, the door may be large enough to completely close the opening portion. In addition, the door may be of the size in which the door is about 5 mm smaller in each side than respective side of the opening portion in such manner that there is provided an aperture (open space) or a gap between the door and the opening portion, while the air pressure in the high cleanliness room is kept higher than that in the lower cleanliness room, thus air flows through the aperture from the high cleanliness room to the low cleanliness room.

The following standards for the above container and loader are proposed and applied: SEMI (Semiconductor Equipment and Material International) Standard E47.1 [Box/Pod (FOUP)], E15.1 [Tool Load Port], E57 [Kinematic Coupling], E62 [Front-Opening Interface Standard (FIMS)], E63 [Box/Opener to Tool Standard (BOLTS)] and the like (hereinafter referred to as "Standard").

The semiconductor wafer is transported through the opening portion between the container with the door opened and the high cleanliness room. However, as described above, it is essential to consider that the semiconductor wafer should not be contaminated by dust. It is therefore necessary to note that the dust floating in the low cleanliness room, the dust attached to the container, particularly, the cover of the container, the dust attached to the door of the loader in the side of the lower cleanliness room, or the dust generated along with the driving of the loader has to be prevented from floating into the high cleanliness room.

As one of the methods to realize the above requirement to prevent the dust from floating into the high cleanliness room, there is disclosed the method in German Patent Application No. 19511024-2 (filed on Mar. 28, 1995), German Patent Application No. 19542646-2 (filed on Nov. 15, 1995), and Japanese Patent Laid-Open Publication No. 8-279546. The method is described hereunder with reference to FIG. 1.

A wall 105 separates a high cleanliness room in the right hand side in the drawing from a low cleanliness room in the left hand side in the drawing. An opening portion of the wall 105 is closed by the door 104 of a loader. A semiconductor wafer 101 is received inside of a container 102, and dust is prevented from floating into the container by a cover 103. The semiconductor wafer is transferred from the inside of the container to the high cleanliness room in the drawing as follows: the container 102 is mounted on a stage 107 of the loader; the cover 103 of the container 102 is fixed onto the door 104 of the loader so as to be unified; thus fix-unified cover 103 and door 104 are pulled out in a horizontal direction by a driving apparatus disposed in the high cleanliness room, and then lowered vertically to be moved eventually to the position illustrated with a dotted line in the drawing; the container 102 and the opening portion of the wall 105 are fully opened; the semiconductor wafer 101 is transferred to the high cleanliness room; and the semiconductor wafer 101 is worked in the high cleanliness room.

In the above process, however, since the cover 103 and the door 104 of the loader are moved into the high cleanliness room, the dust attached thereto is also moved and scattered into the high cleanliness room. Although it is described in the above disclosure that the dust is fixed within a portion tightly held between the cover 103 and the door 104 so that the dust is not scattered in the high cleanliness room, it is however difficult to completely fix the dust so as not to be scattered. It is therefore difficult to prevent the dust from being scattered.

In addition, since the driving apparatus 106 for moving the cover 13 and the door 104 to the high cleanliness room is required to be disposed in the high cleanliness room, the driving apparatus 106 generates dust in the high cleanliness room. When movable portions in the driving apparatus, such as a motor or a cylinder, are operated, dust is generated by friction of the portions. Furthermore, lubricants applied to the movable portions are evaporated in the high cleanliness room, thus it is impossible to keep high cleanliness therein.

Furthermore, since the cover 103 and the door 104 are moved in a horizontal direction by the driving apparatus 106, and then lowered in a vertical direction, the driving apparatus 106 is required to drive the cover and the door in two directions, thus the apparatus becomes in such complex construction that the accuracy of the operation of the apparatus is apt to be lowered and at the same time the cost of the apparatus increases. Furthermore, the time required for one cycle of the operation increases to lead the production efficiency to be poor.

Furthermore, the dust is inevitably generated when the driving apparatus is kept operable, controlled and repaired. Since the driving apparatus is disposed in the high cleanliness room, the dust is scattered in the high cleanliness room. In addition, when a worker carries out workings in the high cleanliness room, it is required to install equipment to remove the dust attached to the body of the worker, thus increasing the cost.

The present invention has been made to solve the above problems of the prior art. The object of the invention is therefore to provide a container and a loader for semiconductors by which a semiconductor wafer is received in a container and transported in a low cleanliness room, the semiconductor wafer is worked in a high cleanliness room, and the semiconductor wafer is transported between the container and high cleanliness room without causing dust to float into the high cleanliness room from the low cleanliness room, and generating dust in the high cleanliness room and with easy maintenance, control and repair of the apparatus.

SUMMARY OF THE INVENTION

In order to attain the above object, there is provided a following invention.

There is provided a first invention, which is a loader disposed in a low cleanliness room along a border between the low cleanliness room and a high cleanliness room, for transporting a dust free article between an inside of a container receiving the dust free article and the high cleanliness room, which comprises: a movable stage for mounting the container; an opening portion through which the dust free article is transported between the inside of the container and the high cleanliness room; a door for opening and closing the opening portion; a unifying means for unifying a cover of the container and the door when the container approaches the door; and a driving apparatus for moving the cover and the door being unified within the loader to simultaneously open and close the opening portion and the container. According to the invention, there can be provided a loader in which dust does not float into the high cleanliness room when the dust free article is transported between the inside of the container and the high cleanliness room.

There is provided a second invention, which provides a loader, wherein a pressure of the high cleanliness room is set higher than that of the low cleanliness room for preventing dust from flowing into the high cleanliness room and the opening portion for the door is constructed so as to have a gap between the opening portion and the door.

There is provided a third invention which provides a loader wherein the driving apparatus is provided within a space formed by a front cover and a wall for driving apparatus.

There is provided a fourth invention, which provides a loader, wherein the cover and the door being unified within the space formed by a front cover and a wall moves vertically. According to the invention, there can be provided a loader in which the bottom area of the loader is made smaller, thus improving efficiency in installing area.

There is provided a fifth invention, which provides a loader, wherein the container mounted on the stage approaches the door horizontally. According to the invention, it is possible to stably move the container on the loader.

There is provided a sixth invention, which provides a loader, wherein the unifying means for unifying the cover and the door comprises: a pin to be inserted in a hole formed in a protrusion arranged on outside of the cover; another pin to be inserted in another hole formed in the door; and a driving mechanism for simultaneously moving both of the pin and the another pin to unify the cover and the door. According to the invention, the dust generated by the unifying means can be prevented from floating into the container, since the unifying means is located outside of the container.

There is provided a seventh invention, which provides loader, which further comprises a driving device for causing the container mounted on the stage to approach to the door. According to the invention, the container can be automatically moved on the loader.

There is provided an eighth invention, which provides a container, for receiving and transporting the dust free article therein and being mounted on a loader which is provided with an opening portion disposed in a low cleanliness room in a border location between a high cleanliness room and the low cleanliness room, and a door for opening and closing the opening portion, which comprises: an opening port through which the dust free article is transported between an inside of the container and the high cleanliness room; a cover which covers the opening port and is to be unified with the door of the loader and then to be moved within the loader to open and close the opening portion; a fixing means for fixing the cover to the opening port when the dust free article is enclosed in the container for transportation. According to the invention, there can be provided a container which prevents the dust from floating into the high cleanliness room when the dust free article is transported between the inside of the container and the high cleanliness room.

There is provided a ninth invention, which provides a container, wherein the cover unified with the door of the loader within the loader moves vertically. According to the invention, a loader is provided in which the bottom area of the loader is made smaller, thus improving efficiency in installing area.

There is provided a tenth invention, which provides a container, wherein an angle, formed by an outward normal line of a surface on which the opening port is closely contacted with the cover and a descending direction of the cover unified with the door of the loader, forms an acute angle. According to the invention, it is possible to prevent the dust from being generated by lowering a friction between the contacting surfaces of the opening portion and the cover.

There is provided an eleventh invention, which provides a container, which further comprises a sealing material for closing tightly both of the cover and the opening port. According to the invention, it is possible to prevent the dust from floating into the container.

There is provided a twelfth invention, which is a container, which further comprises positioning means to position the container in relation to the loader when the container is mounted on the loader. According to the invention, the container can be securely mounted on the loader.

There is provided a thirteenth invention, which provides a container, which further comprises a handle to support the container when the container is transported. According to the invention, the container can be easily transported by a human being or robot.

There is provided a fourteenth invention, which provides a container, which further comprises a protrusion formed on an outer portion of the cover, which has a hole to which a pin is inserted for unifying the cover and the door of the loader. According to the invention, the dust generated by the transfer mechanism of the pin or friction between the pin and the protrusion can be prevented from floating into the inside of the container, since the protrusion for unifying is located outside of the container.

There is provided a fifteenth invention, which provides a container, which further comprises an air cleaning device. According to the invention, the air cleaning device exhausts air inside of the container and hence the dust inside of the container may be expelled.

There is provided a sixteenth invention, which provides an apparatus for transporting a dust free article, including a loader and a container, which comprises: the loader disposed in a low cleanliness room in a border portion between a high cleanliness room and a low cleanliness room, which transports the dust free article between an inside of the container and the high cleanliness room, which comprises: a movable stage for mounting the container to transport the dust free article; an opening portion through which the dust free article is transported between the high cleanliness room and the container; a door for opening and closing the opening portion, which is provided with a gap between the door and the opening portion; a unifying means for unifying a cover of the container and the door when the container approaches the door; and a driving apparatus for simultaneously opening and closing the opening portion of the loader and the container by moving unified cover and door within the loader; and a container which comprises: an opening port through which the dust free article is transported between an inside of the container and the high cleanliness room; and a cover which covers the opening port of the container and is to be unified with the door of the loader and is to be moved within the loader to open and close the opening port of the container; and a fixing means for fixing the cover to the opening port of the container when the dust free article is set in the container and is transported. According to the invention, there is provided an apparatus for transporting a dust free article which prevents the dust from floating into the high cleanliness room when transporting the dust free article between the inside of the container and the high cleanliness room.

There is provided a seventeenth invention, which provides an apparatus for transporting a dust free article, wherein the cover unified with the door of the loader within the loader moves vertically. According to the invention, it is possible to make bottom area of the loader smaller, thus improving efficiency in installing area.

There is provided an eighteenth invention, which provides an apparatus wherein the driving apparatus for simultaneously opening and closing the opening portion of the loader and the container for moving unified cover and door within the loader is disposed within a space formed by a front cover and a wall for driving apparatus.

There is provided a nineteenth invention, which provides an apparatus for transporting a dust free article, wherein the loader further comprises a driving device for causing the container mounted on the stage to approach the door. According to the invention, there is provided an apparatus, which automatically moves the container on the loader.

There is provided a twentieth invention, which provides an apparatus for transporting a dust free article, wherein the container further comprises an air-cleaning device.

There is provided a twenty-first invention, which provides a method for transporting a dust free article, using a loader, provided with a movable stage, a door, a unifying means and a driving means, disposed in a low cleanliness room in a border portion between a high cleanliness room having a higher air pressure than that of the low cleanliness room, and a container receiving the dust free article to be transported, which comprises, mounting the container receiving the dust free article on a movable stage disposed on the loader; causing the container to approach the door of the loader for opening and closing an opening portion of the loader; unifying a cover of the container and the door of the loader; simultaneously moving thus the cover and the door unified within the loader to simultaneously open the opening portion of the loader and the container; and transferring the dust free article received in the container from an inside of the container to the high cleanliness room through the opening portion of the loader. According to the invention, there can be provided a method for transporting a dust free article which can prevent the dust from floating into the high cleanliness room when transporting the dust free article between the inside of the container and the high cleanliness room.

There is provided a twenty-second invention, which provides a method for transporting a dust free article, wherein mounting the container receiving the dust free article on a movable stage disposed on the loader step comprises fixing the container mounted on the movable stage to the movable stage to unify the container and the movable stage; and wherein causing the container to approach the door of the loader for opening and closing an opening portion of the loader is accomplished by moving the movable stage by a driving device included in the loader. According to the invention, there can be provided a method for enabling to automatically move the container on the loader.

There is provided a twenty-third invention, which provides a method for transporting a dust free article, wherein the cover unified with the door of the loader moves vertically. According to the invention, it is possible to make smaller the bottom area of the installation used in the transporting method, thus improving efficiency in the installing area.

BRIEF DESCRIPTION OF THE DRAWINGS

FIG. 3 is a conceptional view illustrating an embodiment of the present invention in which a sectional view of the container and the loader of the invention is shown.

FIG. 6 is a descriptive view illustrating an example of the loader of the invention.

DETAILED DESCRIPTION OF THE INVENTION

The best mode of the embodiments of the invention is described hereunder. The following embodiments do not limit the scope of the invention. A person of skill in the art can therefore execute other embodiments within the scope of the invention.

Figure 1:
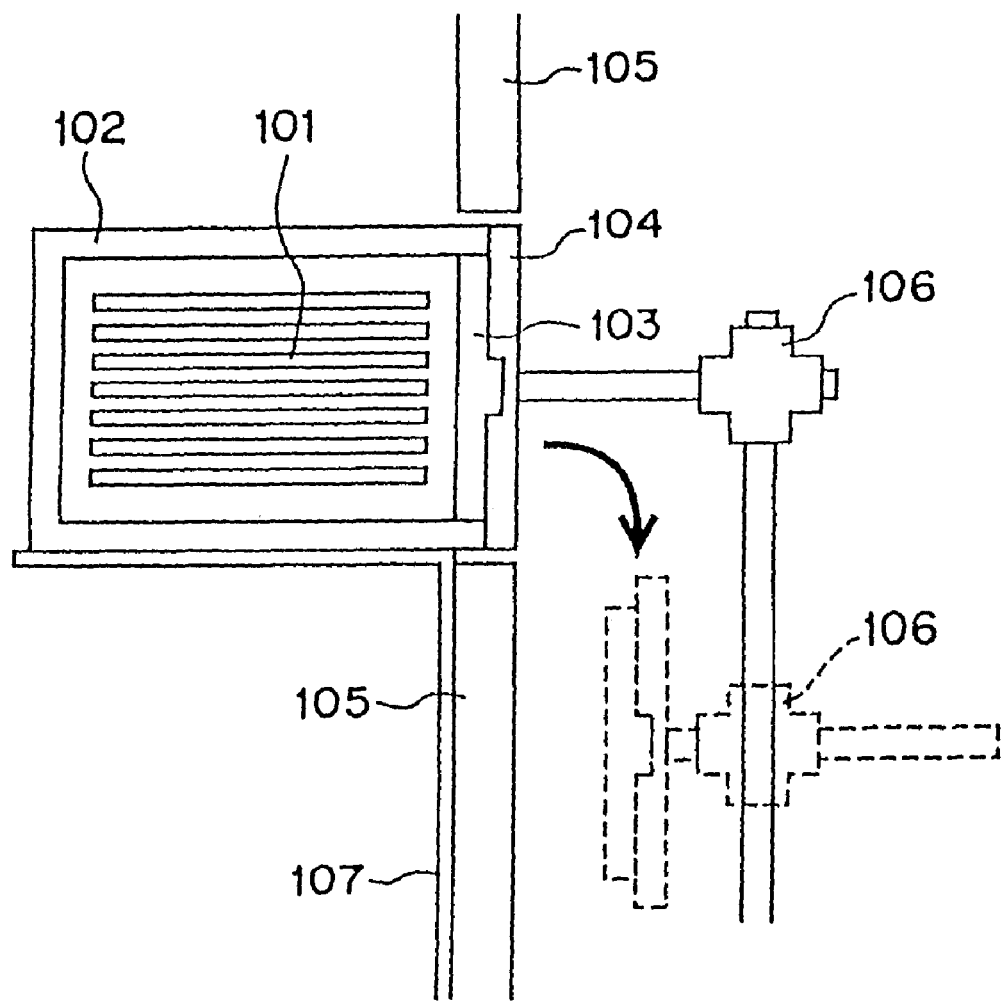
FIG. 1 is a conceptional view illustrating an embodiment of the prior art in which a sectional view of the container and loader is shown.
Figure 2:
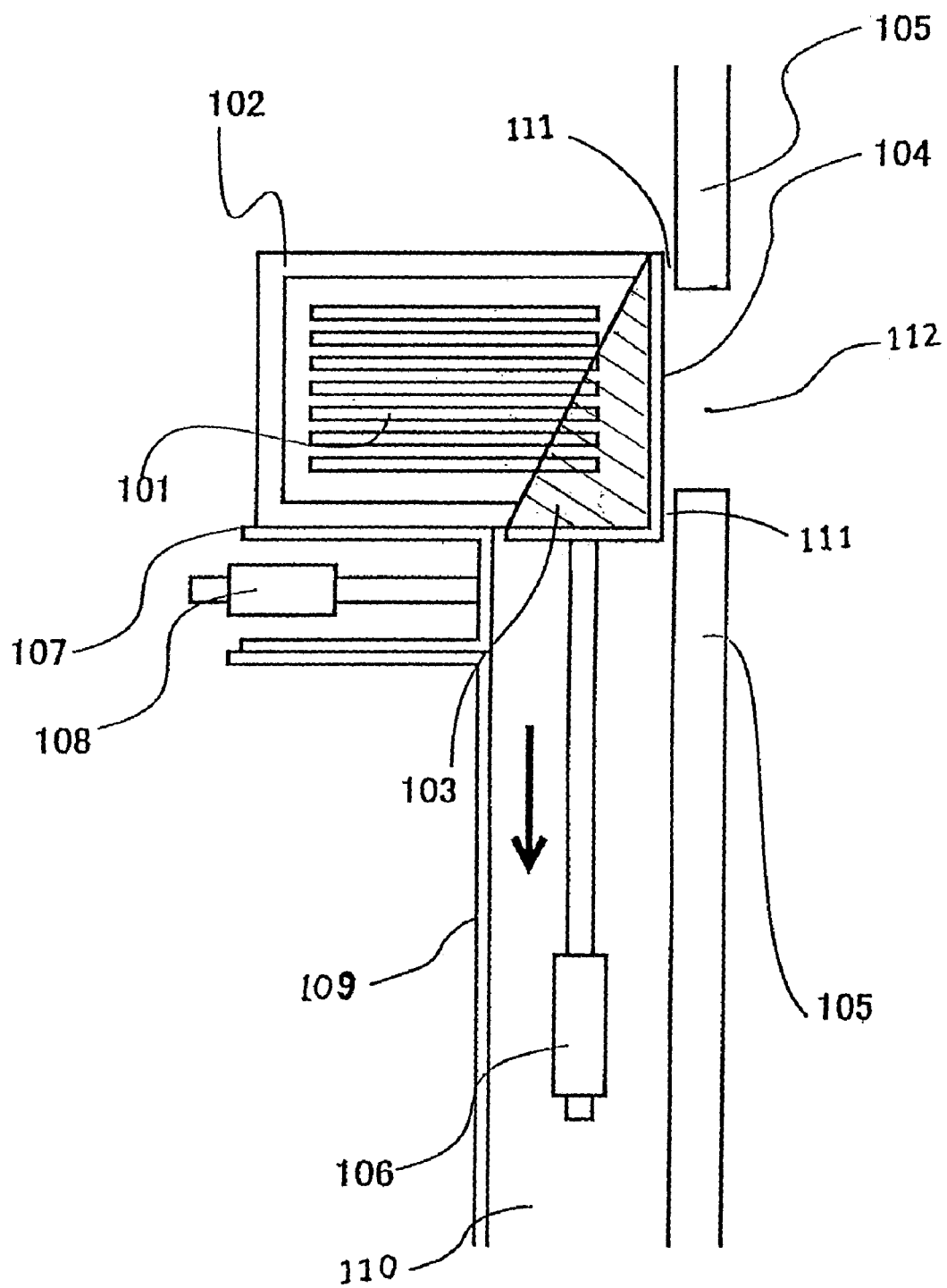
FIG. 2 is a conceptional view illustrating an embodiment of the present invention in which a sectional view of the container and loader of the invention is shown.
Figure 3A:
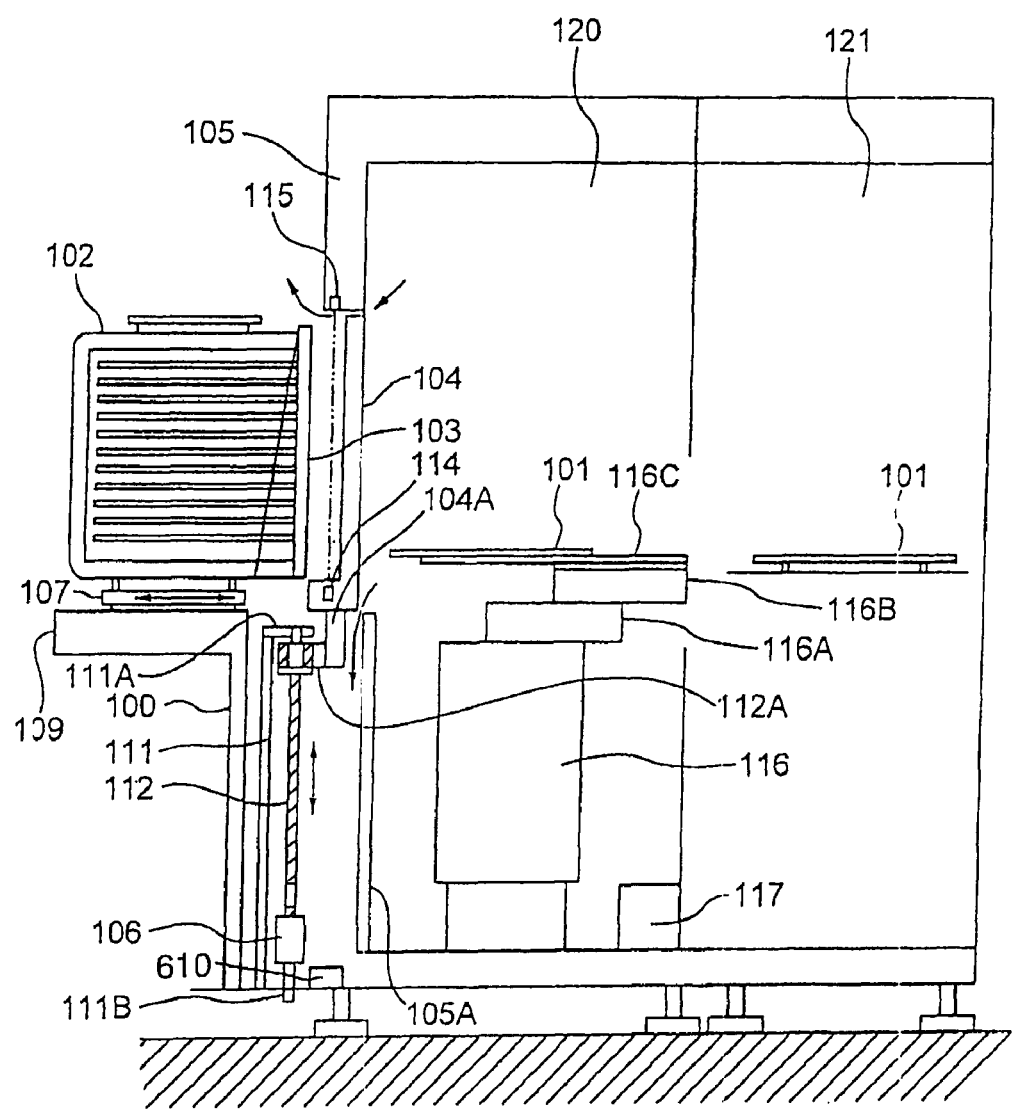
FIG. 3A illustrates the cover unified with the door.

FIGS. 2 and 3 are schematic descriptive views illustrating the container and loader of an invention. In FIG. 2, the high cleanliness room in the right side is separated from the low cleanliness room in the left side by a wall 105 separating a high cleanliness room and a low cleanliness room and forming a cover for the driving apparatus. There is arranged an opening portion 112 in the wall 105, which opening portion 112 is usually closed by the door 104 of the loader. As illustrated above, a gap 111 is provided between the door 104 and the opening portion 112, and the air pressure of the high cleanliness room is controlled so as to be higher than the air pressure of the low cleanliness room, thus causing air to flow from the high cleanliness room to the low cleanliness room to prevent the dust from floating into the high cleanliness room.

The semiconductor wafer is received inside of the container 102, and the container is closed air-tight. Under this condition, the inside of the container 102 is kept in high cleanliness. Accordingly, when container 102 is transported through the low cleanliness room, the semiconductor wafer 101 in the container is never contaminated.

The process for transporting a semiconductor wafer from the container to the high cleanliness room in the present invention is described hereunder.

First, the container 102 is mounted on the stage 107 of the loader. The container 102 may be mounted by the hands of human being, or may be transported by the transporting robot installed in the ceiling or the robot mounted on the AGV running on the floor. For this purpose, a flange may be arranged on the upper portion of the container 102. The above-mentioned transportation may be carried out by the use of the process defined in the standard, for example.

Then, the container 102 is fixed onto the stage 107 in such manner that the container and the stage are unified. The above-mentioned unification is carried out in a predetermined location. For this purpose, the positioning mechanism such as Kinematic Coupling defined in the standard may be disposed. As the method for unifying the container 102 and the stage 107, and positioning, the methods defined in the standard may be applied.

Then, the stage 107 is moved in the direction to the opening portion of the wall 105 to cause the cover 103 to approach the door 104 of the loader. The stage 107 may be moved by the driving device 108. However, there is included the embodiment without the driving device 108 for the stage 107. In this case, when bearings, wheels, rollers and the like, for example, are disposed on the stage to smoothly move the stage in the horizontal direction, the container mounted on the stage may be caused to approach the door 104 by human power. The driving device 108 of the stage 107 is described later.

Then, the cover 103 and the door 104 of the loader are unified. This unification of the cover and the door may be executed by the use of conventional methods such as a clamp mechanism or frictional means. Embodiments of the unification of the cover and the door are described later.

While the cover 103 is kept fixed to the door 104, the stage 107 is moved backward slightly, thus the cover 103 is removed from the container 102. The above-mentioned driving device 108 of the stage 107 may be used as it is for the above backward movement. The means to close or open the container by the cover are described later.

Furthermore, the cover 103 unified with the door 104 are moved downward (within the space 110 formed with the wall 105 and an opposing wall (109) (a front cover 601 in FIG. 6) by the driving apparatus 106. Thus, the container 102 is opened toward the high cleanliness room. FIG. 3 shows that the container is opened toward the high cleanliness room. In this situation, since the air flows from the high cleanliness room to the low cleanliness room, the dust can be prevented from floating into the high cleanliness room.

Finally, the semiconductor wafer 101 is transported from the inside of the opened container to the high cleanliness room and worked therein. After being worked, the semiconductor wafer 101 may be returned to the same container 102, or received in another container through another opening portion. As the means to transport the semiconductor wafer received in the container between the container and the high cleanliness room, the known means such as a robot arm for transporting, for example, a scalar type robot for clean room may be used. The detailed description thereof are omitted here.

After finishing working, when reverse processes are carried out, the semiconductor wafer 101 can be transported from the high cleanliness room to the container 102 while high cleanliness is kept. Then, when the container 102 is air-tightly closed by the cover 103, the semiconductor wafer can be transported through the low cleanliness room.

In the present invention, when the container is not mounted on the stage 107, the opening portion of the wall 105 is closed by the door 104, thus the dust is prevented from floating into the high cleanliness room from the low cleanliness room. Accordingly, high cleanliness can be maintained in the high cleanliness room.

Furthermore, in the present invention, the cover 103 is unified to the door 104, and thus the unified cover and door are moved downward in the low cleanliness room to open both of the opening port of the container and the opening portion of the wall 105. More specifically, since the driving apparatus 106 for driving the cover 103 and the door 104 is located in the low cleanliness room, the dust generated by the driving apparatus 106 does not float into the high cleanliness room. Furthermore, the maintenance, control and repair of the driving apparatus 106 are carried out in the low cleanliness room, thus lowering the required cost thereof.

According to the conventional means, since a single driving mechanism moves the container in both of the horizontal and vertical directions, the driving mechanism becomes complex and the cost thereof increases. In addition, there is a problem in which accuracy of the operation in the driving mechanism is lowered. Contrary to the conventional driving mechanism, in the present invention, the driving apparatus 106 moves the cover and the door in the vertical direction, and the stage driving device 108 moves the apparatus in the horizontal direction. More specifically, since each driving device moves the stage in only one direction, driving devices comprising simple elements can be applied, thus improving accuracy of the operation and lowering the required cost thereof.

Now, the best embodiment of the container of the invention is described with reference to FIGS. 4(A) and 4(B).

Figure 4A:
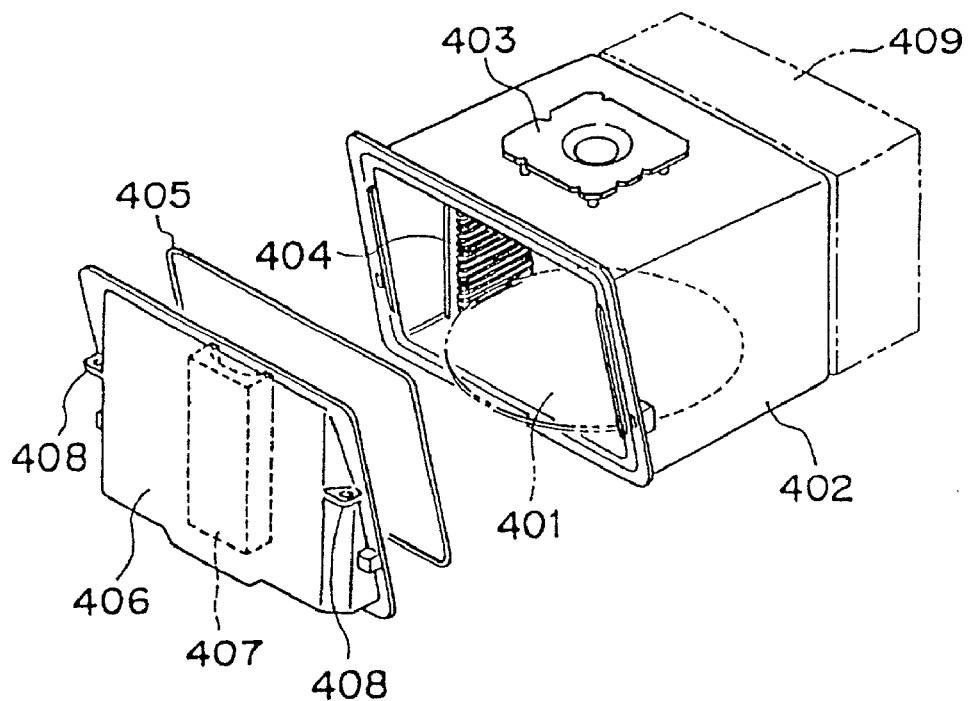
FIG. 4 is a descriptive view illustrating an example of the container of the invention.

In FIG. 4(A), teeth portion 404 is disposed inside of the container 402 to hold the semiconductor wafer 401. The teeth portion 404 can hold a plurality of semiconductor wafers 401.

A flange 403 is disposed on the upper portion of the container 402. The container 402 is automatically moved by the transporting robot installed on the ceiling with the use of the flange. The shape of the flange 403 is about square, each side of which square has different numbers and shapes of rifts. The contact sensor or the like identifies the direction to which the container faces by means of the rifts. It is preferable to apply the flange, the shape of which is defined in the standard.

The container 402 and the cover 406 are air-tightly sealed by means of an O-ring 405 comprising elastic body. The O-ring 405 may be fixed either to the cover 406 or the container 402.

A wafer pressing device 407 comprising elastic body is disposed on the cover 406 in order to prevent the semiconductor wafer 401 from moving or swinging inside of the container when the container is transported. The hole 408 disposed on the cover 406 is disposed so as to receive the pin which unifies the cover and the door of the loader. The mechanism to unify the cover and the door is described later.

Figure 4B:
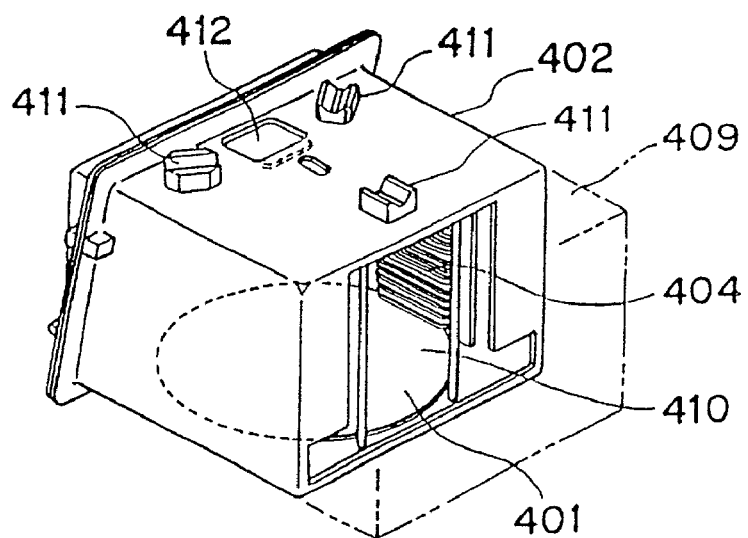

In FIG. 4(B), Kinematic Coupling 411 is disposed on the bottom surface of the container 402. The relative positioning of both of the stage of the loader and the container 402 is carried out by means of the Kinematic Coupling 411. The recess 412 used for clamp mechanism to fix the container 402 to the stage so as to unify the container and the stage. The shape, size and location are preferably in accordance with the standard.

Another opening port, which is different from the opening port of the container located front side thereof, may be disposed in the rear portion of the container 402. In the opening port 410, there can be disposed an air cleaning device 409, for example a fan, which exhausts the air inside of the container 402 to clean the air. However, the above-mentioned another opening port may not be disposed, and the air cleaning device may also not be disposed. In the rear portion of the inside of the container, there may be disposed same wafer pressing device (not shown) as the wafer pressing device 407 disposed on the cover 406 so as to prevent the semiconductor wafer 401 from being damaged.

The cover 406 (103 in FIG. 2) and the container 402 (102 in FIG. 2) are air-tightly sealed by means of the O-ring, as described above. In order to more securely seal the cover and the container, there may be disposed a magnet or an adhesive tape on each of the surfaces with which the cover 406 and the container are contacted. Furthermore, there may be disposed a clamp mechanism (not shown) to fix the cover 406 onto the container 402 in such manner that the cover is not removed from the container when the container is transported.

The angle formed by the outward normal line on the surface on which the opening port of the container 402 is contacted with the cover 406, and a descending direction of the cover unified with the door of the loader is up to 90 degrees. With the above angle to be up to 90 degrees, the container 402 does not disturb the movement of the unified cover and the door when the cover 406 unified with the door are moved.

Figure 5A:
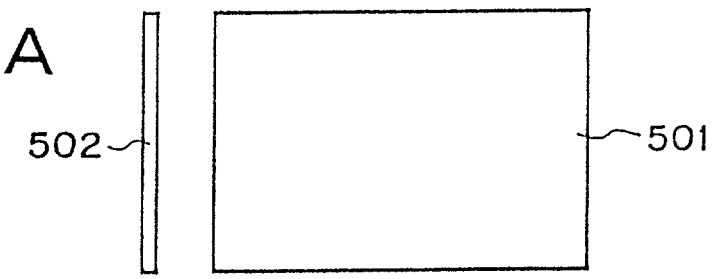
FIG. 5 is a descriptive view illustrating multiple examples of the container of the invention.
Figure 5B:
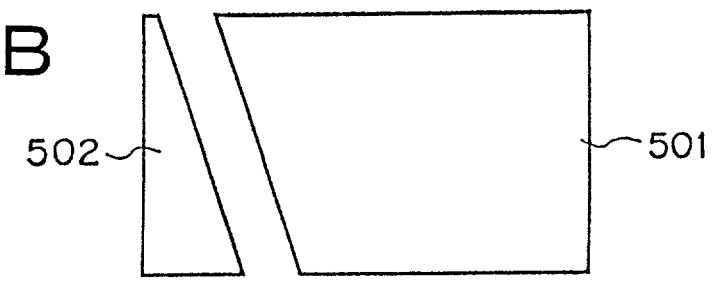
Figure 5C:
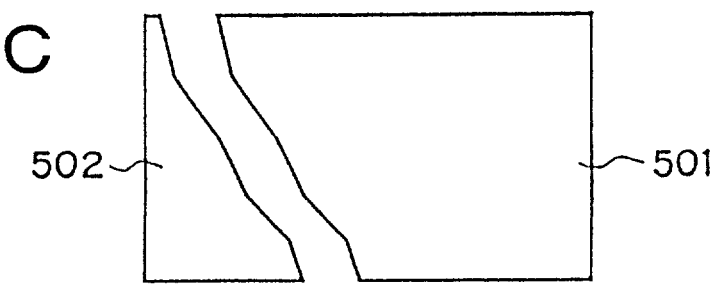
Figure 5D:
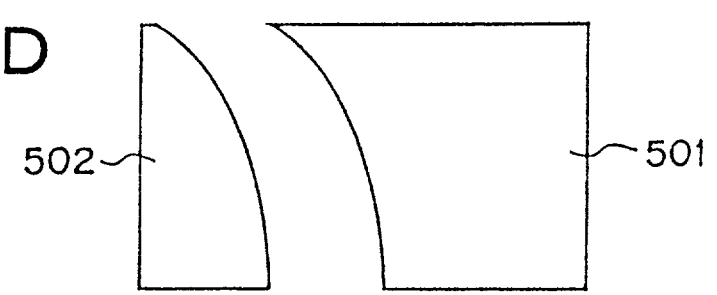

FIGS. 5(A) to 5(D) show various schematic side views of the cover and the container. FIG. 5(A) shows the example in which the angle formed by the outward normal line on the surface on which the opening port of the container 501 is contacted with the cover 502, and a descending direction of the cover unified with the door of the loader is 90 degrees. FIG. 5(B) shows the example in which the angle is about 72 degrees which is not changed. FIG. 5(C) shows the example in which the angle is changed step by step. FIG. 5(D) shows the example in which the angle is changed continuously. Those are the examples in which the angle is positive.

With the above angle to be excessively small, the area of the wall surface and the bottom surface of the container 501 becomes small, thus lowering the (sitting) stability of the container 501. On the other hand, with the angle to be excessively large, the friction between the container 501 or the cover 502 and the elastic O-ring is generated to produce the dust when the cover 502 is moved.

In the present invention, there may be the embodiment in which the container is mounted on the loader, then after the cover and the door are unified, the container is slightly moved backward in the horizontal direction to remove the cover from the main body of the container. In this case, since the gap is produced between the container and the cover, the above-mentioned friction is not generated. Accordingly, it is possible to set the above angle so as to be within the scope from 70 to 90 degrees.

In FIGS. 2 and 3, as described above, the inner mechanism of the loader is briefly described. FIG. 6 shows an outward appearance of one of the embodiments of the loader of the invention.

The driving apparatus 106 of the loader is covered by the front cover 601 (109 in FIG. 2) and the driving apparatus cover 602 of the wall 105 in FIG. 2. The maintenance, inspection and repair of the driving means are easily carried out by pulling the front cover 601 outward (to the frontal direction). The loader as a whole is installed in the low cleanliness room, and the above-mentioned maintenance and the like can be carried out in the low cleanliness room.

On the stage 604 (107 in FIG. 2) of the loader, there are disposed pins of Kinematic coupling which correspond to the V shaped groove of the Kinematic coupling of such standard as formed on the bottom portion of the container, which carry out the positioning of the container. The opening portion 605 of the loader is closed by the door when the container is not mounted, and when the container is mounted the door descends downward in such manner that the semiconductor wafer can be transported between the container and the high cleanliness room.

When the air pressure in the high cleanliness room is caused to be kept higher than the air pressure in the low cleanliness room, the dust can be prevented from floating into the high cleanliness room. Furthermore, for example, when the fan 610 (FIG. 3A) for exhausting is disposed in the lower portion of the cover 602, the air flow from the high cleanliness room to the low cleanliness room is assisted or accelerated. Accordingly, even if the dust generated by the operational friction of the mechanical parts inside of the loader, or the organic compound produced by the evaporation of the lubricant is scattered, the dust or organic compound can be effectively prevented from floating into the high cleanliness room. The degree of the cleanliness of the high cleanliness room in the invention can be therefore kept higher than that of the conventional apparatus and method.

The moving direction of the unified cover and door is not necessarily limited to upward and downward along the vertical direction. The above-mentioned effect can be obtained as far as the unified cover and door moves within the loader installed in the low cleanliness room. However, when the moving direction is selected so as to be the vertical or about vertical direction, it is possible to arrange the loader of the invention side by side in the lateral direction, as shown in FIG. 7.

Figure 7:
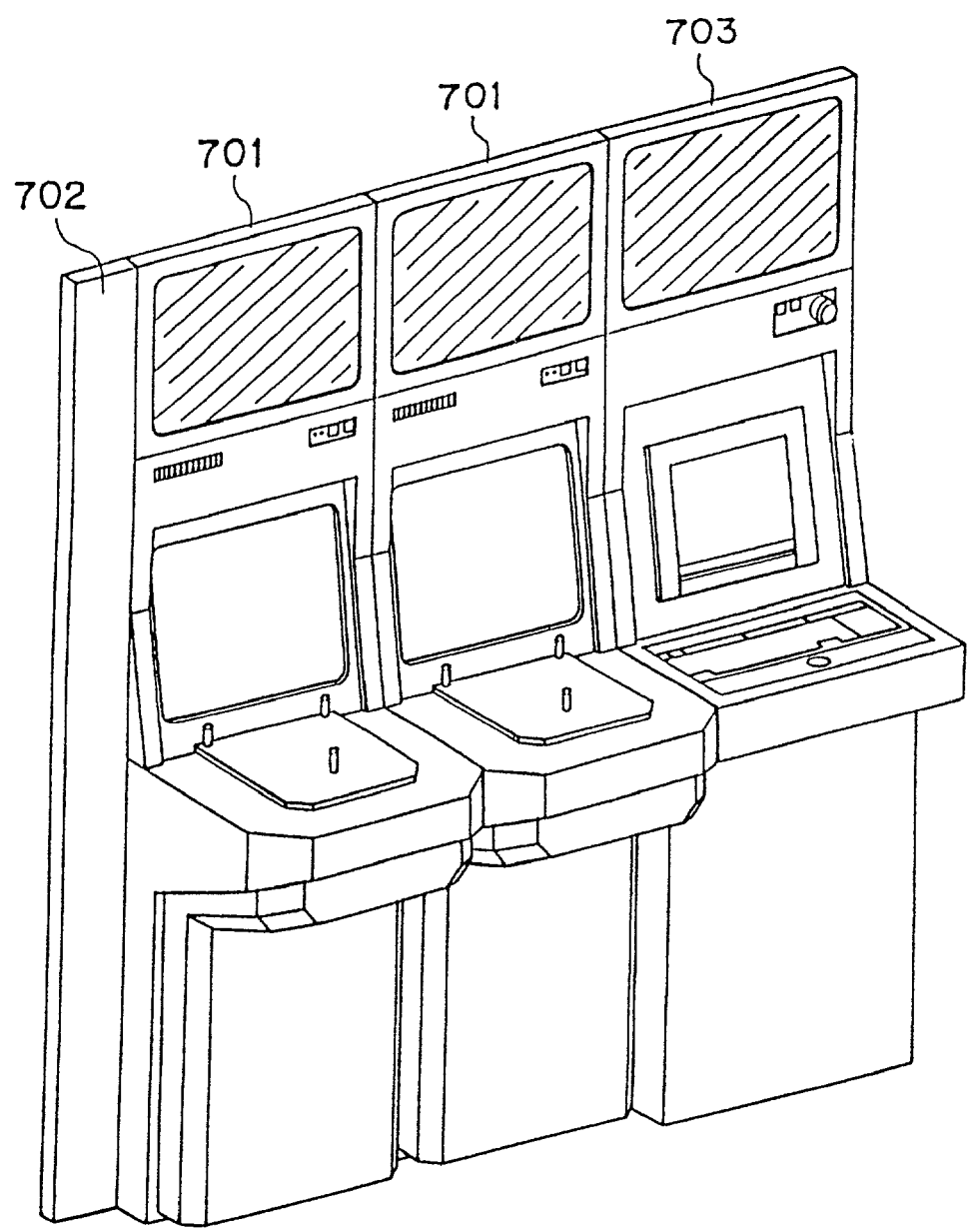
FIG. 7 is a descriptive view illustrating an example when multiple loader are installed in the invention.

FIG. 7 shows the example in which two loaders 701 and the control board 703 are arranged on the wall 702 (105 in FIG. 2). According to this arrangement, for example, one loader is restricted to solely carry in the semiconductor wafer, and the other loader is restricted to solely carry out the semiconductor wafer, thus enabling to transport and work the semiconductor wafer in sequential operation. Furthermore, since the bottom area of the loader itself is relatively small, the area is efficiently used when the loaders are installed in the factory.

Figure 8A:
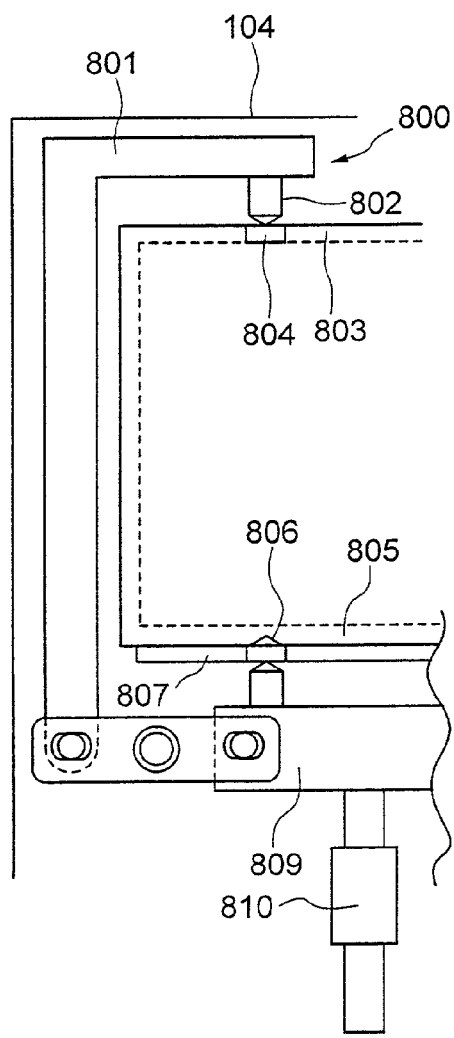
FIG. 8 is a descriptive view illustrating an example of unifying means for unifying the door of the loader and the cover of the container of the invention.
Figure 8B:
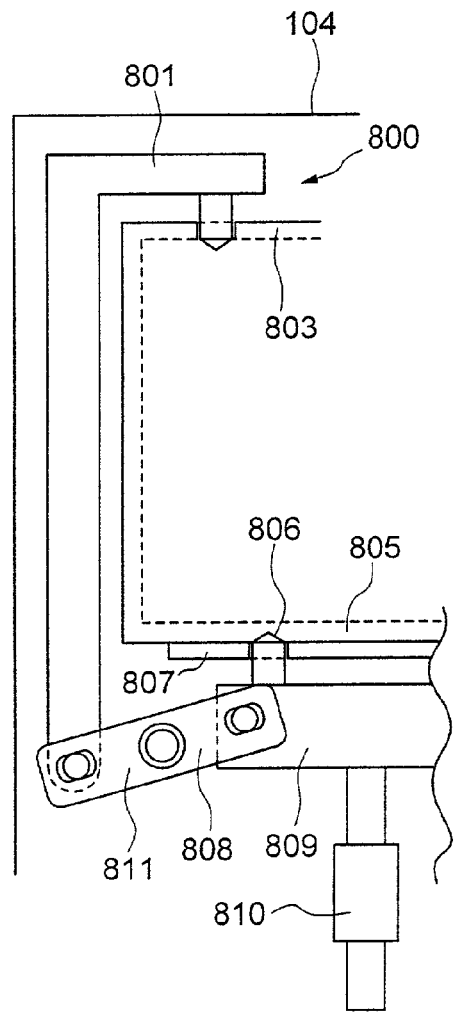

FIG. 8 shows one example of the means to unify the cover and the door. There is disposed the protrusion 803 having the hole 804 on the outer portion of the cover of the container, and there is disposed a hole on the bottom portion 807 of the door of the loader. In addition, there is disposed the recess 806 on the bottom portion 805 of the cover which corresponds to the hole of the bottom portion 807 of the door of the loader. The unifying means for unifying the cover and the door is disposed in the loader. The driving mechanism 810 is caused to take such rectilinear motion that the rotary lever 808 is caused to rotate around the axis 811. As a result, the bar 801 descends, and the pin located at the tip portion thereof thrusts the hole 804 of the protrusion 803 on the cover of the container. At the same time, the supporter 809 ascends, and the pin located at the tip portion thereof thrusts the hole of the bottom portion 807 of the door and is received in the recess 806 of the bottom portion 805 of the cover. As described above, according to the present invention, by preparing such a simple rectilinear motion of the driving mechanism 810 provided with the rotary lever 811, and the bar 801 and supporter 809, it is possible to provide the unifying mechanism of the door and the cover with a low cost.

In the conventional art, since the lock mechanism to unify the cover and the door is installed inside of the container, when the cover and the door are opened, the dust generated by the lock mechanism may float into the inside of the container by the air flow of the high cleanliness room, thus contaminating the inside of the container. On the contrary, in the present invention, since the lock mechanism can be installed outside of the container, the inside of the container is not contaminated.

As described above, according to the invention, the semiconductor wafer can be effectively prevented from being contaminated by the dust even when the container is transported through the low cleanliness room, since the semiconductor wafer is received and transported by the sealed container. When the semiconductor is to be worked, the cover of the container and the door of the loader are unified, and thus unified cover and door descends in the low cleanliness room, thus the container and the high cleanliness room are opened and the semiconductor wafer is transported between the container and the high cleanliness room. Since all the mechanical elements to generate the dust are disposed in the low cleanliness room side, it is possible to keep a high degree of high cleanliness in the high cleanliness room.

The present invention can be applied not only to the working of the semiconductor, but also to the container and the loader for articles other than the semiconductor which require high cleanliness in the working thereof.

What is claimed is:

1. A loader disposed in a low cleanliness room in a border between the low cleanliness room and a high cleanliness room having a higher pressure than the low cleanliness room, the loader comprising:
    a movable stage positioned in the low cleanliness room for mounting a container in such a manner that the entire container remains in the low cleanliness room, and a cover to be removed from a main body of the container is positioned to face the high cleanliness room, the movable stage being horizontally movable relative to a wall that separates the low cleanliness room from the high cleanliness room;
    an opening portion in the wall through which a dust free article is transported between an inside of the container and the high cleanliness room;
    a door for opening and closing the opening portion;
    a unifying means for unifying the cover of the container and the door in the low cleanliness room;
    means for moving the movable stage away from the wall that separates the low cleanliness room from the high cleanliness room, to separate the container from the cover unified with the door;
    a covered area for a driving apparatus provided in the low cleanliness room below the opening portion in the wall;
    the driving apparatus positioned in the covered area for moving the cover and the door vertically downward together, to be stored in the covered area and to simultaneously open the opening portion and the container;
    a gap provided all around the door, between the opening portion and the door, through which air flows out from the high cleanliness room to the low cleanliness room to prevent dust flowing into the high cleanliness room, wherein the open container that has been separated from the cover unified with the door is positioned such that the air flowing out from the high cleanliness room to the low cleanliness room will flow into the open container; and
    an assist fan positioned in a lower part of the covered area, whereby the air flow from the high cleanliness room to the low cleanliness room is assisted.

2. The loader of claim 1, wherein the driving apparatus is provided within a space formed by a front cover and a wall for the driving apparatus.

3. The loader of claim 1, wherein the container mounted on the stage approaches the door horizontally.

4. The loader of claim 1, wherein the unifying means for unifying the cover and the door comprises:
    a pin to be inserted in a hole formed in a protrusion arranged on the outside of the cover;
    another pin to be inserted in another hole formed in the door; and
    a driving mechanism for simultaneously moving both of the pin and the another pin to unify the cover and the door.

5. The loader of claim 1, which further comprises a driving device for moving the container mounted on the stage to the door.

6. The loader of claim 1, wherein the driving apparatus is provided within a space formed by a front cover and a wall for the driving apparatus and the cover and the door are adapted to move vertically with the space.

7. The loader of claim 1, wherein the assist fan is an exhaust fan provided to exhaust air from the covered area.

8. An apparatus for transporting a dust free article, which comprises:
    a loader disposed in a low cleanliness room in a border portion between a high cleanliness room and a low cleanliness room having a lower pressure than the high cleanliness room, the loader comprising:
    a movable stage positioned in the low cleanliness room for mounting a container to transport the dust free article in such a manner that the entire container remains in the low cleanliness room, and a cover to be removed from a main body of the container is positioned to face the high cleanliness room, the movable stage being horizontally movable relative to an opening portion;

the opening portion through which the dust free article is transported between the high cleanliness room and the container;

a door for opening and closing the opening portion, which is provided with a gap all around the door, between the door and the opening portion, through which air flows out from the high cleanliness room to the low cleanliness room;

a unifying means for unifying the cover of the container and the door in the low cleanliness room when the container approaches the door;

means for moving the movable stage away from the opening portion through which the dust free article is transported between the high cleanliness room and the container, to separate the container from the cover unified with the door;

a covered area for a driving apparatus in the low cleanliness room and below the opening portion;

the driving apparatus positioned in the covered area for opening the opening portion of the loader and the container by moving the unified cover and door vertically downward, to be stored in the covered area;

wherein the container comprises: an opening port, comprising the opening portion, through which the dust free article is transported between an inside of the container and the high cleanliness room; a cover which covers the opening port of the container and is to be unified with the door of the loader, the cover and the door are adapted to move within the loader to open and close the opening port of the container; and a fixing means for fixing the cover to the opening port of the container when the dust free article is set in the container and is transported, wherein the open container that has been separated from the cover unified with the door is positioned such that the air flowing out from the high cleanliness room to the low cleanliness room will flow into the opening port of the container; and an assist fan positioned in a lower part of the covered area, whereby the air flow from the high cleanliness room to the low cleanliness room is assisted.

9. The apparatus of claim 8, wherein the driving apparatus for opening and closing the opening portion of the loader and the container by moving the unified cover and door within the loader is disposed within a space formed by a front cover and a wall for the driving apparatus.

10. The apparatus of claim 8, wherein the loader further comprises a driving device for causing the container mounted on the stage to approach the door.

11. The apparatus of claim 8, wherein the container further comprises an air-cleaning device.

12. The apparatus of claim 8, wherein the assist fan is an exhaust fan provided to exhaust air from the covered area.

13. A method for transporting a dust free article, using a loader, provided with a movable stage, a door, a unifying means and a driving means, disposed in a low cleanliness room in a border portion between a high cleanliness room having a higher air pressure than that of the low cleanliness room, and a container receiving the dust free article to be transported, which comprises:

mounting the container receiving the dust free article on the movable stage horizontally movable relative to a wall that separates the low cleanliness room from the high cleanliness room, disposed on the loader in such a manner that the entire container remains in the low cleanliness room, and a cover to be removed from a main body of the container is positioned to face the high cleanliness room;

causing the container to approach the door of the loader for opening and closing an opening portion of the loader;

flowing air from the high cleanliness room to the low cleanliness room through a gap provided all around the door of the loader;

unifying the cover of the container and the door of the loader in the low cleanliness room;

moving the movable stage away from the wall that separates the low cleanliness room from the high cleanliness room, to separate the container from the cover unified with the door;

moving the cover and the door unified within the loader vertically downward, to be stored in a covered area for the driving means, using the driving means, to open the opening portion of the loader and the container;

positively exhausting air from the covered area using an assist fan positioned in a lower part of the covered area, whereby the air flow from the high cleanliness room to the low cleanliness room is assisted;

transferring the dust free article received in the container from an inside of the container to the high cleanliness room through the opening portion of the loader, wherein the loader is located in the low cleanliness room while the dust free article is being transferred, wherein the open container that has been separated from the cover unified with the door is positioned such that the air flowing through the gap from the high cleanliness room to the low cleanliness room will flow into the open container.

14. The method of claim 13, further comprising:

fixing the container mounted on the movable stage to the movable stage to unify the container in the movable stage; and wherein causing the container to approach the door of the loader for opening and closing the opening portion of the loader is done by moving the movable stage by a driving device in the loader.

15. The method of claim 13, wherein the cover of the container and the door of the loader unified within the loader is moved vertically.

16. The method of claim 13, wherein the assist fan is an exhaust fan provided to exhaust air from the covered area.

17. A loader comprising:

a movable stage for mounting a container in such a manner that the entire container remains in a low cleanliness room, and a cover to be removed from a main body of the container is positioned to face a high cleanliness room having a higher pressure than the low cleanliness room, the movable stage being horizontally movable relative to a wall that separates the low cleanliness room from the high cleanliness room;

a door for opening and closing an opening portion, provided in the wall, for transporting a dust free article between an inside of the container and the high cleanliness room;

a unifying means for unifying the cover of the container and the door in the low cleanliness room;

means for moving the movable stage away from the wall that separates the low cleanliness room from the high cleanliness room, to separate the container from the cover unified with the door;

a covered area for a driving apparatus provided in the low cleanliness room below the opening portion in the wall;

the driving apparatus for moving the cover and the door vertically downward together within the loader to, to be stored in the covered area for the driving apparatus and to simultaneously open the opening portion and the container; and a gap provided all around the door through which air flows out from the high cleanliness room to the lower cleanliness room to prevent dust flowing into the high cleanliness room, wherein the open container that has been separated from the cover unified with the door is positioned such that the air flowing out from the high cleanliness room to the low cleanliness room will flow into the open container; and an assist fan positioned in a lower part of the covered area, whereby the air flow from the high cleanliness room to the low cleanliness room is assisted.

18. The loader of claim 17, wherein the assist fan is an exhaust fan provided to exhaust air from the covered area.

* * * * *